United States Patent
Blidberg et al.

[11] Patent Number: 5,870,300
[45] Date of Patent: Feb. 9, 1999

[54] VOLTAGE CONVERTER HAVING A COMMUTATION CIRCUIT WITH REDUCED INDUCTANCE

[75] Inventors: Ingemar Blidberg; Olle Ekwall, both of Ludvika, Sweden

[73] Assignee: Asea Brown Boveri AB, Västerås, Sweden

[21] Appl. No.: 942,622

[22] Filed: Oct. 2, 1997

[30] Foreign Application Priority Data

Mar. 24, 1997 [SE] Sweden ................................. 9701069

[51] Int. Cl.$^6$ ........................ H02M 7/5387; H02M 7/44; H02M 1/00
[52] U.S. Cl. ........................... 363/132; 363/141; 363/144
[58] Field of Search ..................... 363/131, 132, 363/141, 142, 144

[56] References Cited

U.S. PATENT DOCUMENTS

| | | | |
|---|---|---|---|
| 3,913,003 | 10/1975 | Felkel ....................................... | 257/665 |
| 4,010,489 | 3/1977 | Bourbeau et al. ....................... | 257/714 |
| 4,161,775 | 7/1979 | Franz et al. .............................. | 363/145 |
| 4,301,465 | 11/1981 | Masselin ................................. | 257/714 |
| 4,578,745 | 3/1986 | Olsson .................................... | 363/141 |
| 4,941,079 | 7/1990 | Ooi ......................................... | 363/132 |
| 5,184,291 | 2/1993 | Crowe et al. ............................ | 363/37 |
| 5,535,113 | 7/1996 | Konishi .................................... | 363/35 |

FOREIGN PATENT DOCUMENTS 2 050 082   12/1980   United Kingdom ............ H02M 1/00

*Primary Examiner*—Peter S. Wong
*Assistant Examiner*—Bao Q. Vu
*Attorney, Agent, or Firm*—Pollock, Vande Sande & Amernick

[57] ABSTRACT

A VSC converter has each current valve of a phase leg formed by a plurality of units of semiconductor elements and rectifying members, located on top of each other forming at least one stack. The phase leg is constructed according to the flat cable principle with the phase leg formed by such stacks arranged side by side in pairs at small distances (d) running back and forth. A cooling plate of electrically conducting material is arranged between each unit in the stacks.

12 Claims, 3 Drawing Sheets

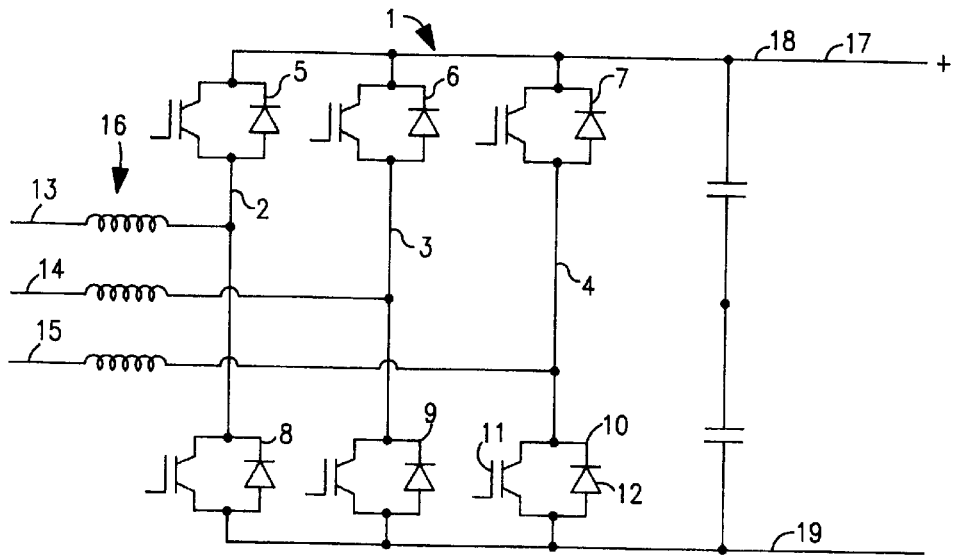
FIG. 1
PRIOR ART
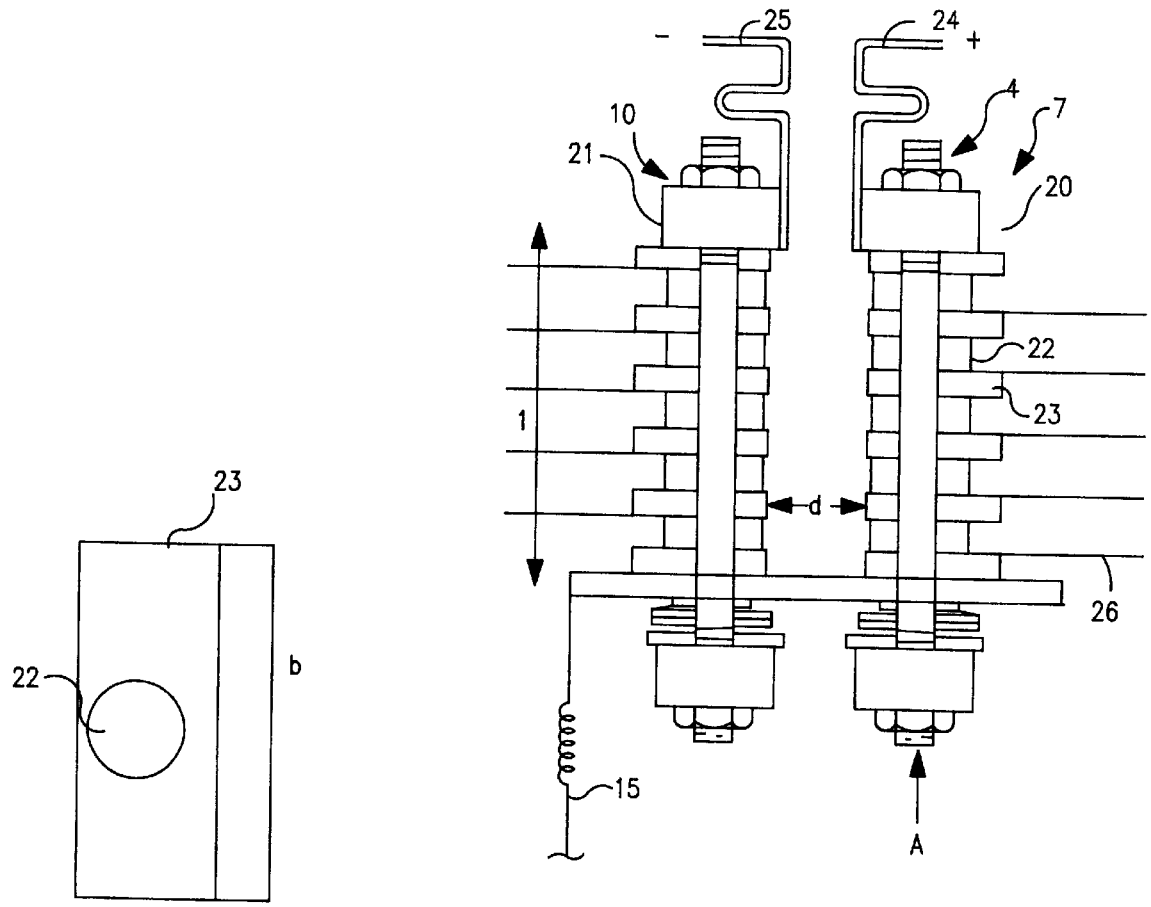
FIG. 3
FIG. 2

VOLTAGE CONVERTER HAVING A COMMUTATION CIRCUIT WITH REDUCED INDUCTANCE

BACKGROUND OF THE INVENTION

The present invention relates to a VSC converter (Voltage Source converter) for converting direct voltage into alternating voltage or alternating voltage into direct voltage, and which has at least one phase leg with two valves connected in series, each having at least one turn-off type semiconductor element, and one rectifying member connected anti-parallel therewith. A point on the phase leg between the valves is connected to a phase of a direct or alternating voltage network, and the opposite ends of the phase leg are each connected to a pole conductor of a direct voltage network.

Such a VSC converter connecting a direct voltage network with an alternating voltage network bas recently become known through the thesis "PWM and control of two and three level High Power Voltage Source Converters" by Anders Lindberg, Kungliga Tekniska Högskolan, Stockholm, 1995. In this thesis, a plant for transmitting electric power through a direct voltage network for High Voltage Direct Current (HVDC) utilizing such a converter is described. Before issuance of the thesis, plants for transmitting electric power through a direct voltage network for High Voltage Direct Current were based upon the use of a line-commutated CSC (Current Source Converter) converter in stations for power transmission. VSC (Voltage Source Converter) converters for forced commutation have now instead become an alternative since the development of IGBTs (Insulated Gate Bipolar Transistor=bipolar transistor having an insulated gate) for high voltage applications. IGBTs are connected in series to form valves of converters since they may be easily turned on and turned off simultaneously. This type of transmission of electric power between a direct voltage network for High Voltage Direct Current, which is voltage-stiff therethrough, and alternating voltage networks, offers several important advantages with respect to the use of line-commutated CSCs in HVDC. The consumption of active and reactive power may thus be independently controlled and there is no risk of commutation failures in the converter, and thereby no risk of transmission of commutation failures between different HVDC links, which may take place in a line-commutated CSC. Furthermore, along with other advantages, there now exists the possibility to feed a weak alternating voltage network or a network without generation capabilities of its own, i.e., a dead alternating voltage network.

The invention is not restricted to the above-described application, but the converter may just as well be intended for conversion of direct voltage into direct voltage in a DC/DC converter, in which only one phase is present. The word "network" is also to be given wide scope. However, the problem of the invention will now be illuminated for this application, although the problem is common to all conceivable applications falling within the scope of the invention.

The use of a VSC converter instead of a current-stiff CSC converter presents a totally new problem, which will now be explained with reference to FIG. 1. FIG. 1 shows a VSC converter 1 having three phase legs 2, 3, 4 with two current valves 5–10, each comprising at least one semiconductor element of a turn-off type, such as an IGBT 11, and a rectifying member in the form of a diode 12 connected anti-parallel therewith. The phase legs are connected to phase 13, 14, 15 of a three-phase alternating voltage network 16. The opposite ends of the converter are connected to a direct voltage network 17 having a positive pole conductor 18 and a negative pole conductor 19. Thus, the converter is formed by a so-called 6-pulse bridge.

If one now considers, for example, the phase 15 and assume that the semiconductor element of the current valve 10 is turned on, and a current flows from the alternating voltage network through this semiconductor element 11 and to the direct voltage network, a turning off of the semiconductor element 11 of the current valve 10 will cause the current to continue from the phase 15 in the direction towards the direct voltage network, but now through the diode of the current valve 7. This is called commutation.

The commutation times are short, and comparatively large time derivative current occurs, which makes it desirable to lower the inductance in the commutation circuit as far as possible, i.e., the inductance i the phase leg, the line connected between the two poles of the direct voltage network and capacitors. This is to avoid unnecessarily high overvoltages and thereby losses at commutations.

BRIEF SUMMARY OF THE INVENTION

The object of the present invention is to provide a VSC converter of the type defined in the introduction, in which the problem mentioned above has been solved in a satisfactory manner.

This object is, according to the invention, obtained by forming each current valve in such a converter by a plurality of units of turn-off type semiconductor elements, and rectifying members arranged on top of each other in at least one stack. The phase leg is constructed according to the flat cable principle formed by such stacks running back and forth in pairs, and arranged side-by-side at small distances, and having a cooling plate of electrically conducting material arranged between, and connected in series with each unit in the stacks.

By utilizing the so-called flat cable principle in this totally new application, the inductance of the commutation circuit, more exactly of the phase leg, may be lowered to very low levels, so that the losses may be reduced to an acceptable low level. By placing the units of turn-off type semiconductor elements and rectifying members on top of each other in a stack, a short path for the current through a certain number of units is obtained. This reduces the inductance which is proportional to the length. Furthermore, by bringing the current in such stacks of the same pair to run in different directions, the inductance is lowered by the flat cable effect in which the inductance is substantially proportional to the distance between the stacks of such a pair. The "cooling plate" also includes the case in which no cooling medium or the like is provided for draining heat, but cooling takes place simply by the fact that the plate absorbs heat and emits it to the surrounding medium, such as air. An arrangement of such cooling plates also makes it possible to arrange the units closer, i.e., to stack them with intermediate cooling plates so that the inductance may be reduced.

According to a preferred embodiment of the invention, the plates have a large extension in the direction substantially perpendicular to a line interconnecting stacks arranged side-by-side. Since the inductance of such a pair of stacks in this case will be inversely proportional to the extension of the stacks in the direction substantially perpendicular to a line interconnecting stacks arranged side by side, the inductance may be reduced substantially by the cooling plate design.

According to another preferred embodiment of the invention, that side of each stack that is turned towards one side of the other stack of the same pair is free from gate units and other equipment, so that the spacing between stacks is determined only by the requirement of a minimum electrical free distance. By ensuring that all such additional equipment, such as gate units, voltage dividers and cooling pipes, are placed out of the way, it is only the electric voltage between stacks located side-by-side, and the voltage withstanding capability of the components included in the stacks, that restrict how short the distance between the two stacks may be, and, therefore, how low the inductance can be. It is emphasized that along with a low inductance of the commutation circuit, a compact construction of the converter with small space requirements is obtained.

According to another preferred embodiment of the invention, one of the pair of stacks has parts placed side-by-side at a larger distance therebetween than the parts of another side-by-side stack pair having a lower voltage therebetween than the voltage between the parts of the first pair of stacks. By letting the voltage between the stacks determine the distance between the stacks, a lower inductance may be obtained for stacks having a lower voltage than for a stack pair having the highest voltage between the stacks.

According to another preferred embodiment of the invention, which constitutes a further development of the previous embodiment, parts having different mutual distances are formed by a division of each stack into consecutive substacks with the distance between stacks changed stepwise along the length of the stacks. Such a realization of different distances for different voltages between different parts of the stacks may sometimes be preferred from the manufacturing and mounting point of view. It appears that "stack" in this context is to broadly include the case in which a stack may be divided into so-called sub-stacks, which are arranged in lines displaced laterally with respect to each other.

According to another preferred embodiment of the invention, which constitutes an alternative to the previous embodiment, the two stacks of to the same pair are mutually inclined, so that the distance increases linearly from one end thereof to the other. The smallest possible distance between the two stacks along the entire length thereof is in this way obtained with respect to the required electrical free distance between stacks.

According to another preferred embodiment of the invention, the distance between the two current valves belonging to the same phase leg increases in the direction away from the phase connection point. The voltage between two current valves of the same phase leg increases in that direction, so that it is advantageous to increase the distance between the current valves in the direction of increasing voltage difference between stacks.

According to another preferred embodiment of the invention, each current valve of a phase leg is formed by one stack, and the stacks of a pair are connected at adjacent ends to a pole conductor, and at opposite ends to a phase of a direct or alternating voltage network. It is advantageous, from the inductance and space saving point of view, to form the phase leg of the converter with respect to what is shown in FIG. 1 discussed above, bent back to the mid-point between the two current valves.

According to another preferred embodiment of the invention, each current valve of a phase leg is formed by one or more pairs of stacks. This embodiment is advantageous in that a comparatively large number of semiconductor elements and rectifying members have to be included in each current valve for sustaining a high voltage, and it is difficult to obtain a stable construction with very long stacks. A low inductance of the phase leg is, in this way, still obtained.

According to another preferred embodiment of the invention, the converter has a plurality of phase legs for connection to a plurality of phases of an alternating voltage network, and adjacent phase legs have a common connection to a pole conductor of a direct voltage network. Such a physical arrangement of the different phase legs makes it possible to obtain a compact construction of the converter by the fact that the phase legs are located close to each other, and keeps the inductance low through short conducting lengths.

According to another preferred embodiment of the invention, the number of phase legs is three and they are arranged side by side, with two of the phase legs provided with a connection to a pole conductor in common with the mid-phase leg, and these two common connections are connected to different pole conductors of a direct voltage network. It is in this way possible to obtain a zig-zag-like extension of the different valves and a compact construction of the converter while respecting the required electrical free distances.

According to another preferred embodiment of the invention, the converter comprises means for suspending the stacks in a frame. The word "frame" is here intended to be given a broad meaning and comprises a type of rigid or fixed base, such as, for example, a ceiling in a building. The current valves may, by such a suspension of the stacks, be arranged without being acted on by forces other than gravity, and they will be comparatively insensitive to ground vibrations, such as earthquakes, when they are suspended primarily in the ceiling of a building.

According to another preferred embodiment of he invention, the converter is intended to be connected to a direct voltage network for High Voltage Direct Current (HVDC). A series connection of a comparatively great number, as many as thirty, of said units is required to form a current valve, so that the invention is particularly well suited for this application.

Further advantages as well as advantageous features of the invention will appear from the following description and the claims.

BRIEF DESCRIPTION OF THE DRAWINGS

With reference to the appended drawings, below follows a description of preferred embodiments of the invention cited as examples.

FIG. 1 is a schematic diagram illustrating the structure of a VSC converter of the type according to the invention;

FIG. 2 is a detailed view of a phase leg of a converter according to a first preferred embodiment of the invention;

FIG. 3 is a sectional view of a switching unit including a semiconductor element and rectifying member as well as a cooling plate in the direction of the arrow A in FIG. 2;

DETAILED DESCRIPTION OF THE INVENTION

Figure 4:
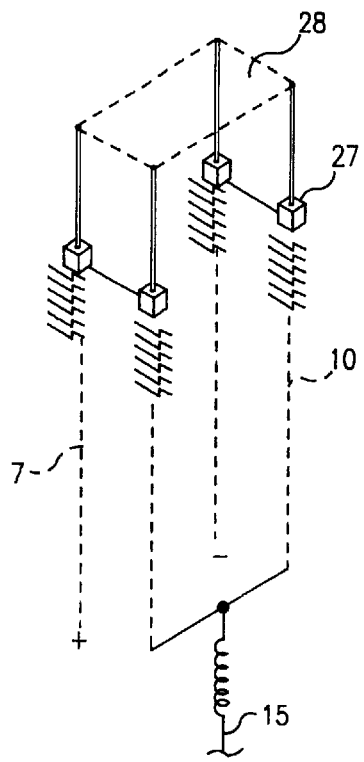
FIG. 4 is a simplified view of a phase leg of a converter according to a second preferred embodiment of the invention.

FIG. 1 illustrates schematically the structure of a VSC converter connected between a direct voltage network for High Voltage Direct Current (HVDC=High Voltage Direct Current) and a three-phase alternating voltage network. Each phase leg of the converter has two so-called current valves, which include turn-on and turn-off type switches 11 connected in series, preferably in the form of IGBTs, and rectifying members connected anti-parallel therewith, i.e., diodes 12. A great number of switches 11 and diodes 12 may be connected in series in a single valve so as to be turned on and turned off simultaneously to function as a single switch. As a result, the voltage across the valve is distributed among the different switches 11 connected in series. The control of the switches 11 takes place by pulse width modulation (PWM). The inductance problems present in such a converter have been carefully disclosed in the introductory portion of the specification. A great number of embodiments of converters according to the invention for reducing the commutation inductance, and parts of such converters, will now be described with reference to FIGS. 2 through 9.

FIG. 2 shows how a phase leg 4 of a converter is constructed according to the flat cable principle with the phase leg formed by stacks 20, 21 running back and forth, located side by side a small distance d, and each forming a current valve. The stacks of switching units 22 comprising semiconductor elements and rectifying members have a cooling plate 23 of electrically conducting material, preferably aluminum, arranged between the stacks and connected in series with each unit 22. FIG. 3 shows the cooling plates 23 have a large extension b in the direction substantially perpendicular to a line interconnecting stacks arranged side-by-side so that the phase leg, similar to a flat cable, is formed by a comparatively flat and wide element running in one direction, and an identical element extending back a short distance from the first one in the opposite direction. In this way the currents through the two stacks of units run in opposite directions. "Large" usually means in this context that the extension in that direction is clearly larger than that of an individual unit, preferably more than twice the extension of the latter ones. A very low inductance of the phase leg is, in this way, obtained, which is also proportional to the length l of a stack and is reduced even more through compact stacking of the breakers 11 and diodes 12. More exactly, the following formula is, with a certain approximation, valid for the inductance L:

$$L = \mu \cdot \frac{d}{b} \cdot l$$

in which $\mu$ is the magnetic permeability.

Through the flat cable-like structure of the phase leg of the converter shown in FIG. 2, an inductance of this phase leg being several orders of magnitude lower than the inductance of a freely located conductor of the corresponding length may be obtained.

With respect to the embodiment according to FIG. 2 and 3, it may be added that the two pole connections 24, 25 to the plus and minus pole conductor, respectively, of the phase leg are located at the same end of the phase leg, and connections of additional equipment, such as gate units for the IGBTs, voltage dividers and cooling pipes to the cooling plates 23, are indicated by 26, and are located to not interfere with the determination of the distance d.

The structure of a phase leg of a converter according to a second preferred embodiment of the invention is schematically illustrated in FIG. 4. In this embodiment, a pair of stacks constructed according to the flat cable principle form separate current valves 7, 10 of the phase leg. It also illustrates how the converter may be provided with means 27 for suspending the stacks in the ceiling 28 of the building.

Figure 5:
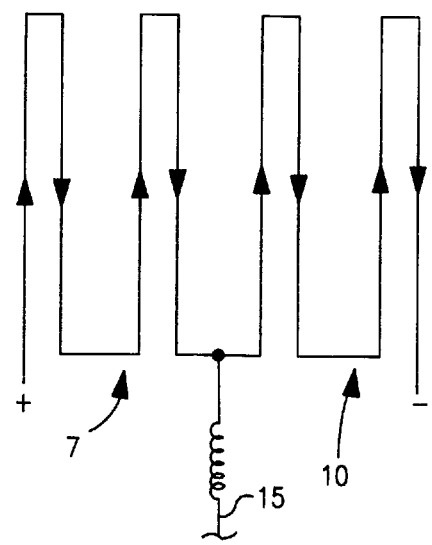
FIG. 5 is a very simplified sketch illustrating a design of a phase leg of a converter according to a third preferred embodiment of the invention.

FIG. 5 schematically illustrates what a phase leg may look like in a converter according to a third preferred embodiment of the invention, in which two pairs of stacks constructed according to the ribbon cable principle form each current valve, and this structure may be advantageous when very high voltages are sustained by the current valve, which means that a large number of turn-off type semiconductor elements must be connected in series.

Figure 6:
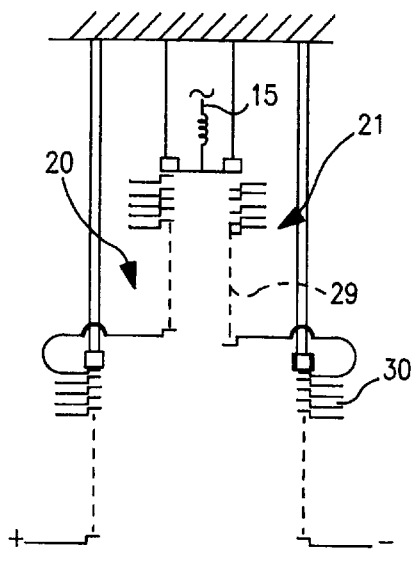
FIG. 6 is a view of a phase leg of a converter according to a fourth preferred embodiment of the invention.

FIG. 6 illustrates how a phase leg may be constructed in a converter according to a fourth preferred embodiment of the invention by dividing each stack 20, 21 forming a current valve into two sub-stacks 29, 30 for obtaining a distance between the stacks varying stepwise, so that this distance may be made smaller where the voltage between adjacent stack parts is lower than at the end 31 where it is the highest.

Figure 7:
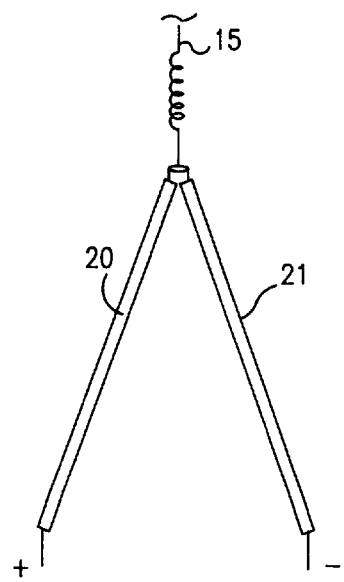
FIG. 7 is a view of a phase leg of a converter according to a fifth preferred embodiment of the invention.

FIG. 7 shows how a phase leg of a converter according to a fifth preferred embodiment of the invention may be designed to obtain the goal of the embodiment shown in FIG. 6, but with a linear increase of the distance between the two stacks towards the end where the voltage therebetween is the highest.

Figure 9:
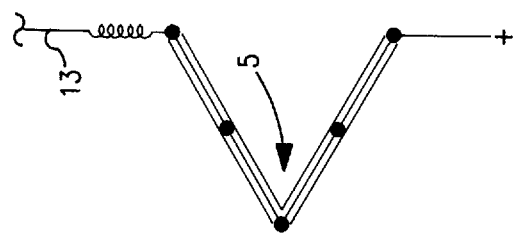
FIG. 9 is a view in the direction of the arrow B in FIG. 8 of a current valve of the converter according to the embodiment of FIG. 8.
Figure 8:
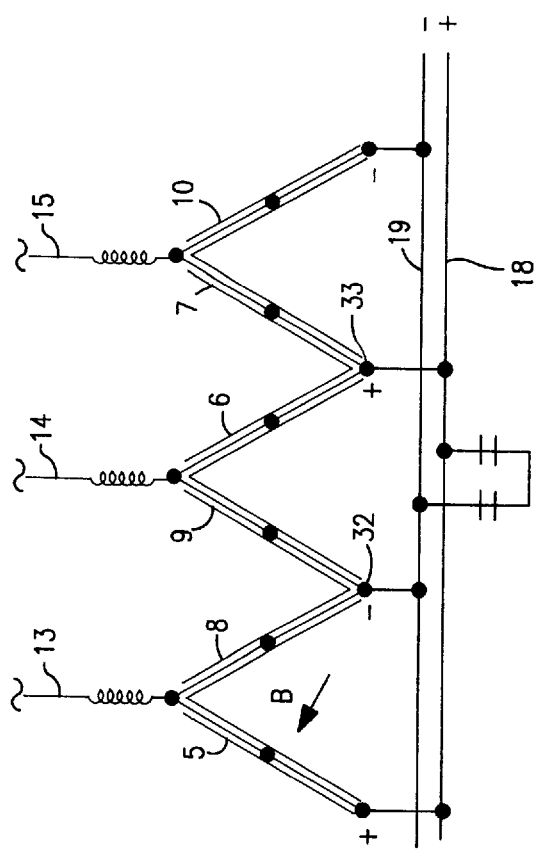
FIG. 8 is a very simplified view of a converter having three phase legs according to a sixth preferred embodiment of the invention.

The structure of a converter having three phase legs according to a sixth preferred embodiment of the invention is schematically illustrated in FIGS. 8 and 9. Adjacent current valves are, as seen from above, arranged at an angle with respect to each other, so that the distance thereof is the largest where the voltage therebetween is the highest, while the corresponding design for each pair of stacks forming a current valve, but in planes extending perpendicularly to the drawing plane in FIG. 8. The phase legs are arranged side-by-side with the two outer phase legs 2, 4 provided with a connection 32, 33 to a pole conductor 19 and 18, respectively, of the direct voltage network in common with the mid phase leg 3. A compact construction is thereby obtained.

The invention is, of course, not in any way restricted to the preferred embodiments described above, but many possibilities to modifications thereof will be apparent for one skilled in the art without departing from the basic idea of the invention.

The number of stacks of the phase leg may different from that shown in the drawings; thus, the angles made by the stacks of the same pair may be different, the number of sub-stacks in stacks having a distance changing stepwisely may be another, and so on.

The VSC converter may also be of different types, such as two-level converter, NPC converter, etc.

Also, the phrase "cooling plate" is to be given a broad meaning in the sense that "cooling plate" is intended to comprise an amount of plate-like structures, in which opposite flat sides do not necessarily have to be completely in parallel with each other, but may, for example, have bulges, grooves, or the like.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A VSC converter comprising:

a first valve means including a plurality of switching units connected in series, each of said switching units including a turn-off rectifier semiconductor switching element connected in parallel with an element which carries current in a direction opposite of the current carrying direction of said semiconductor switching element and a cooling plate, said plurality of switching units forming a first stack of units;

a second valve means adjacent to said first valve means including a plurality of switching units connected in series, each of said switching units including a turn-off rectifier semiconductor switching element connected in parallel with an element which carries current in a direction opposite a current carrying direction for said semiconductor element, and a cooling plate, said plurality of switching units forming a second stack of units being arranged side by side with respect to the first stack of units and spaced a small distance therefrom;

one phase of a direct voltage network or an alternating voltage network being connected to one end of each of said first and second stacks of units, the remaining ends of said first and second stacks of switching units being connected to a pole conductor each of a direct voltage network, said first and second stacks of switching units carrying current in opposite directions simulating a flat cable thereby lowering an effective inductance for said first and second stacks of switching units.

2. The VSC converter according to claim 1 wherein said cooling plates are perpendicular to an axis of a respective stack.

3. The VSC converter according to claim 1 wherein said first and second stack of units are positioned so that said remaining ends are further apart than said one end of each stack of units to provide an electrical free distance which increases towards said remaining ends.

4. The VSC converter according to claim 1 wherein said first and second stacks of units are spaced so that higher voltage portions of said stacks are spaced a greater distance from each other than lower voltage portions.

5. The VSC converter according to claim 3 wherein the space between said first and second stacks of units change stepwise.

6. The VSC converter according to claim 3 wherein the space between said first and second stacks of units increases linearly.

7. The VSC converter according to claim 1 further comprising:

a third valve means including a plurality of switching units connected in series, each of said switching units including a turn-off semiconductor switching element rectifier connected in parallel with an element which carries current in a direction opposite of the current carrying direction of said semiconductor switching element; and a cooling plate, said series of switching units forming a third stack of units;

a fourth valve means including a plurality of switching units connected in series, each of said switching units including a turnoff semiconductor switching element rectifier connected in parallel with an element which carries current in a direction opposite a current carrying direction of said semiconductor element, a cooling plate, said series of switching units forming a fourth stack of units;

a second phase of said alternating voltage network being connected to one end of each of said third and fourth stacks, the remaining ends of said third and fourth stacks of switching units being connected to said direct voltage network.

8. The VSC converter according to claim 7 wherein said second and third stacks remaining ends are connected to each other and to said direct voltage network.

9. The VSC converter according to claim 7 further comprising:

a fifth valve means including a plurality of switching units connected in series, each of said switching units including a turn-off semiconductor switching element rectifier connected in parallel with an element which carries current in a direction opposite of the current carrying direction of said semiconductor switching element and cooling plate, said series of switching units forming a fifth stack of units;

a sixth valve means including a plurality of switching units connected in series, each of said switching units including a turn-off semiconductor switching element rectifier connected in parallel with an element which carries current in a direction opposite a current carrying direction of said semiconductor element and a cooling plate, said series of switching units forming a sixth stack of units; and a third phase of said alternating voltage network being connected to one end of each of said fifth and sixth stacks, the remaining ends of said fifth and sixth stacks of switching units being connected to said direct voltage network.

10. The VSC converter according to claim 9 wherein said second and third stack remaining ends are connected to each other, and said fourth and fifth stacks remaining ends are connected to each other.

11. The VSC converter according to claim 10 wherein said first and second stacks remaining ends, said third and fourth stacks remaining ends, and said fifth and sixth remaining ends are spaced from each other.

12. The VSC converter according to claim 1 wherein said first and second stacks are connected to a frame.

* * * * *